(12) United States Patent
Na et al.

(10) Patent No.: US 8,373,475 B2
(45) Date of Patent: Feb. 12, 2013

(54) PHASE INTERPOLATOR AND DELAY LOCKED-LOOP CIRCUIT

(75) Inventors: Tae-Sik Na, Seoul (KR); Yang-Ki Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/270,509

(22) Filed: Oct. 11, 2011

(65) Prior Publication Data

US 2012/0086486 A1    Apr. 12, 2012

(30) Foreign Application Priority Data

Oct. 11, 2010   (KR) .................. 10-2010-0098802

(51) Int. Cl.
   *H03L 7/06*   (2006.01)
(52) U.S. Cl. ....................... 327/158; 327/149
(58) Field of Classification Search .............. 327/149, 327/158
   See application file for complete search history.

(56) References Cited

U.S. PATENT DOCUMENTS

| 6,768,361 | B2 * | 7/2004 | Kwak ........................... 327/158 |
| 6,982,578 | B2 | 1/2006 | Lee |
| 7,339,408 | B2 * | 3/2008 | Lee ............................... 327/158 |
| 7,991,359 | B2 * | 8/2011 | Tamura ........................ 455/63.1 |
| 2004/0217789 | A1 * | 11/2004 | Kwak et al. .................... 327/158 |
| 2008/0063124 | A1 * | 3/2008 | Song et al. ..................... 375/355 |
| 2008/0197830 | A1 * | 8/2008 | Mehas et al. .................. 323/318 |
| 2008/0242255 | A1 * | 10/2008 | Tamura ........................ 455/334 |
| 2008/0315963 | A1 * | 12/2008 | Huang ............................ 331/74 |
| 2009/0163166 | A1 * | 6/2009 | Lin ................................ 455/260 |
| 2009/0179674 | A1 * | 7/2009 | Tamura et al. ................ 327/155 |
| 2011/0001527 | A1 * | 1/2011 | Lee ............................... 327/158 |
| 2011/0012639 | A1 * | 1/2011 | Tamura ........................ 326/22 |
| 2011/0285434 | A1 * | 11/2011 | Shumarayev et al. ........ 327/156 |
| 2012/0086486 | A1 * | 4/2012 | Na et al. ........................ 327/158 |
| 2012/0155142 | A1 * | 6/2012 | King ............................... 365/63 |

FOREIGN PATENT DOCUMENTS

KR   1020080061953 A   7/2008
KR   1020090000512 A   1/2009

* cited by examiner

*Primary Examiner* — Adam Houston
(74) *Attorney, Agent, or Firm* — Muir Patent Consulting, PLLC

(57) ABSTRACT

A phase interpolator includes a delay difference detector and a phase interpolation driver. The delay difference detector receives a delay code to detect a delay difference. The phase interpolation driver includes two or more driver blocks complementarily operating, and the phase interpolation driver interpolate two input signals in response to the delay difference to provide an interpolated output signal. Each of two or more driver blocks includes a plurality of unit drivers, each input of the unit drivers is commonly connected, and each delay of the two or more driver blocks is varied according to the delay difference.

18 Claims, 13 Drawing Sheets

PHASE INTERPOLATOR AND DELAY LOCKED-LOOP CIRCUIT

CROSS-REFERENCE TO RELATED APPLICATIONS

This application claims priority under 35 USC §119 to Korean Patent Application No. 10-2010-0098802, filed on Oct. 11, 2010 in the Korean Intellectual Property Office (KIPO), the contents of which are herein incorporated by reference in their entirety.

BACKGROUND

1. Technical Field

Example embodiments relate to semiconductor devices, and more particularly to a phase interpolator and a delay locked-loop circuit.

2. Description of the Related Art

In general, internal circuits of semiconductor devices employ circuits for adjusting fine delay time of input/output signals for various purposes. Particularly, phase interpolators are generally adopted for adjusting delay time of internal clock signals. These phase interpolators receive two or more input signals having different phases, and generate interpolated phase signals whose phase are between the phases of the input signals. The phase interpolators are employed in various application circuits because the phase interpolators may be simply implemented with hardwares and the phase interpolators may output desired phase signals precisely.

SUMMARY

Some example embodiments provide a phase interpolator capable of maintaining high linearity.

Some example embodiments provide a delay locked-loop (DLL) circuit including the phase interpolator.

According to some example embodiments, a phase interpolator includes a delay difference detector and a phase interpolation driver. The delay difference detector may detect a delay difference between a first input signal and a second input signal, and output a first delay control signal that indicates whether the delay difference is greater or smaller than a reference value. The phase interpolation driver includes a first set of drivers, and the phase interpolation driver is configured to interpolate two input signals in response to the delay difference to provide an interpolated output signal. The first set of drivers includes a first plurality of drivers and a second plurality of drivers, an input for each driver of the first plurality of drivers is connected to the first input signal, an input for each driver of the second plurality of drivers is connected to the second input signal, and outputs for the first and second plurality of drivers are commonly connected. The first and second plurality of drivers are enabled when the delay difference is smaller than the reference value, and are disabled when the delay difference is greater than the reference value.

According to some example embodiments, a delay locked-loop (DLL) circuit includes a phase detector, a control logic circuit, a delay line circuit and a phase interpolator. The phase detector compares a first clock signal and a feedback output signal. The control logic circuit outputs coarse lock information and fine lock information according to a comparison result of the phase detector. The delay line circuit that receives a clock signal and output a first delayed clock signal and a second delayed clock signal, and perform the coarse locking. The phase interpolator interpolates the first delayed clock signal and the second delayed clock signal, and outputs a clock output signal. The phase interpolator includes a delay difference detector and a phase interpolation driver. The delay difference detector may detect a delay difference between the first delayed clock signal and second delayed clock signal, and outputs a first delay control signal that indicates whether the delay difference is greater or smaller than a reference value. The phase interpolation driver includes a first set of drivers, and interpolates the first and second delayed clock signals based on the first delay control signal, and output the clock output signal. The first set of drivers includes a first plurality of drivers and a second plurality of drivers, an input for each driver of the first plurality of drivers is connected to the first delayed clock signal, an input for each driver of the second plurality of drivers is connected to the second delayed clock signal, and outputs for the first and second plurality of drivers are commonly connected. The first and second plurality of drivers are enabled when the delay difference is smaller than the reference value, and are disabled when the delay difference is greater than the reference value.

In some embodiments, a method of interpolating a first clock signal and a second clock signal for a phase interpolator. The method includes detecting a delay difference between the first and second clock signals; increasing a driver ability of the phase interpolator when the delay difference is smaller than a reference value; decreasing the driver ability of the phase interpolator when the delay difference is greater than the reference value; and outputting an output signal of the phase interpolator according to the increased or decreased driver ability.

Accordingly, the phase interpolator may increase linearity of the interpolated output signal without regard to a delay difference of the input signals.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
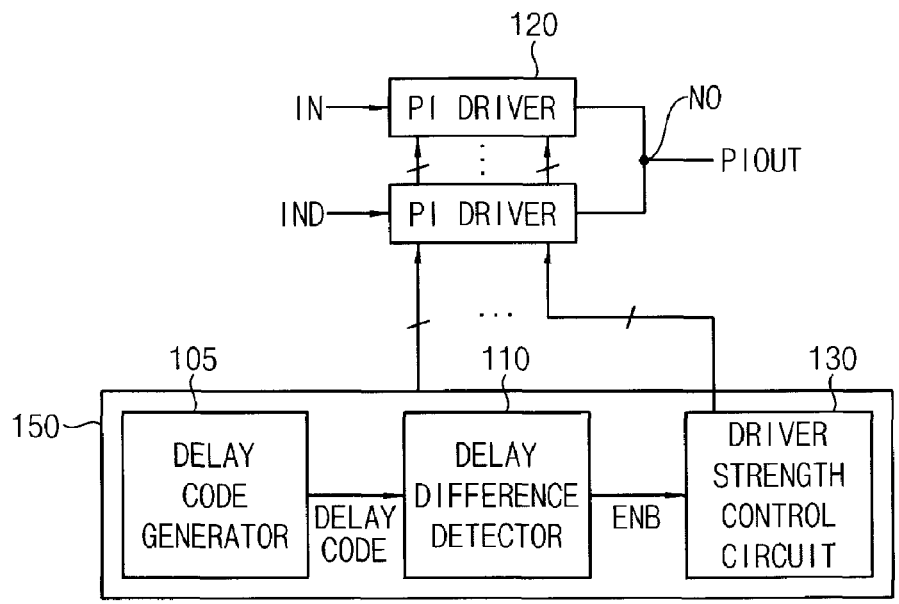
FIG. 1 is a block diagram illustrating a phase interpolator according to an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a phase interpolator according to an example embodiment.

Referring to FIG. 1, a phase interpolator 100 may include a delay code generator 105, a delay difference detector 110, a phase interpolation driver 120 and a driver strength control circuit 130. A delay control circuit 150 may include the delay code generator 105, the delay difference detector 110 and the driver strength control circuit 130.

The delay difference detector 110 detects a phase delay difference (or delay difference) of two input signals such as a delay code DELAY CODE and outputs an output signal ENB based on the delay code DELAY CODE. The phase interpolation driver 120 performs a phase interpolation according to output information of the delay difference detector 110. The driver strength control circuit 130 controls driver strength of the phase interpolation drivers 120 according to the phase delay difference.

The delay code DELAY CODE may include coarse lock information which the delay line circuit receives, when the phase interpolator 100 operates for fine lock operation in a DLL circuit.

The phase interpolation driver 120 may receive two input signals IN and IND output from a delay line circuit having a plurality of delay cells (not shown). The delay code generator 105 outputs the delay code DELAY CODE that has information about a delay difference between adjacent two delay cells of the plurality of delay cells of the delay line circuit. The two input signals IN and IND are selected from the delay line circuit based on the delay code DELAY CODE.

The phase interpolation driver 120 may include two or more driver blocks, and each of the driver blocks receives respective input signals having different phases with respect to each other. In addition, in one embodiment, the two or more driver blocks complementarily operate between each other. Since the two or more driver blocks are turned on/off complementarily between each other, a phase of an interpolated output signal PIOUT (also referred to as "phase interpolator output signal") provided from an output node NO of the phase interpolation driver 120 may be determined based on a number of unit drivers that are turned on in each of the driver blocks included in the phase interpolation driver 120.

The phase interpolation driver 120 may include additional drivers which are turned on/off under control of the driver strength control circuit 130. Each of the additional drivers may be included in each of the unit drivers. For example, additional drivers may be turned off when the delay difference between two adjacent delay cells of the plurality of delay cells of the delay line circuit is greater than a reference value. That is, driver strength of each of the unit drivers may be reduced resulting in a slew rate of the interpolated output signal PIOUT decreasing.

For example, when the delay difference is not greater than a reference value (that is, when the value of the delay code DELAY CODE is in a predetermined range), the driver strength of each unit drivers may be recovered by turning on the additional drivers.

For example, the delay line circuit may include first through 10th delay cells where each delay cell has a delay amount of 10 ps, and 11th through 20th delay cells where each delay cell has a delay amount of 30 ps. When a reference value is 20 ps and the delay code DELAY CODE selects 11th delay cell of the delay line circuit, the output signal ENB of the delay difference detector outputs a signal to disable a set of drivers of the phase interpolation driver (for example, drivers associated with the 11th through 20th delay cells).

Alternatively, when the delay code DELAY CODE selects the 9th delay cell of the delay line circuit, the output signal ENB of the delay difference detector outputs a signal to enable a set of drivers of the phase interpolation driver (for example, drivers associated with the 1st through 10th delay cells).

For example, when the delay difference of the delay code DELAY CODE is in a predetermined range, the interpolated output signal PIOUT has linearity even when the phase interpolation driver 120 is driven in full strength. In addition, when the delay difference of the delay code DELAY CODE is out of the predetermined range, the interpolated output signal PIOUT has a gentle slew rate by reducing the driving strength.

Figure 2:
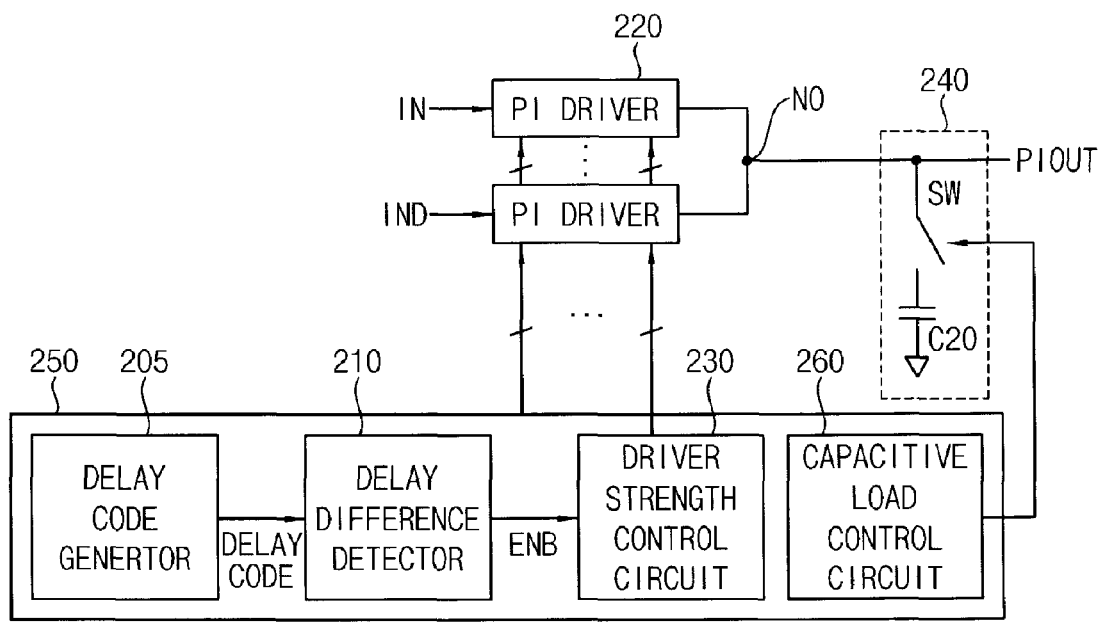
FIG. 2 is a block diagram illustrating a phase interpolator according to another example embodiment.

FIG. 2 is a block diagram illustrating a phase interpolator according to another example embodiment.

Referring to FIG. 2, a phase interpolator 200 may include a delay code generator 205, a delay difference detector 210, a plurality of phase interpolation driver 220, a driver strength control circuit 230, a capacitive load 240 and a delay control circuit 250. The delay control circuit 250 further includes a capacitive load control circuit 260.

Each operation of the delay code generator 205, the delay difference detector 210, the phase interpolation drivers 220 and the driver strength control circuit 230 may be substantially the same as each operation of the delay code generator 105, the delay difference detector 110, the phase interpolation drivers 120 and the driver strength control circuit 130 in FIG. 1, and thus detailed description on each operation of the delay code generator 205, the delay difference detector 210, the phase interpolation drivers 220 and the driver strength control circuit 230 may be omitted.

The capacitive load 240 includes a capacitor C20 and a switch SW. The switch SW is turned on/off under control of the capacitive load control circuit 260. The capacitor C20 is connected to/disconnected from the output terminal NO according to the switch SW being turned on/off.

For example, when delay difference between the two input signals (for example, IN and IND in FIG. 3) is greater than a reference value, in addition to operating the drive strength control circuit 230, the capacitor C20 is connected to the output terminal NO by turning on the switch SW. When the capacitor C20 is connected to the output terminal NO, capacitance of the output terminal NO is increased by a capacitance of the capacitor C20. When the capacitance of the output terminal NO is increased by a capacitance of the capacitor C20, a slew rate of the interpolated output signal PIOUT is made gentle similarly as the additional drivers are turned off in FIG. 1. The switch SW may include a plurality of switches and the capacitor C20 may be implemented with a plurality of capacitors.

Figure 3A:
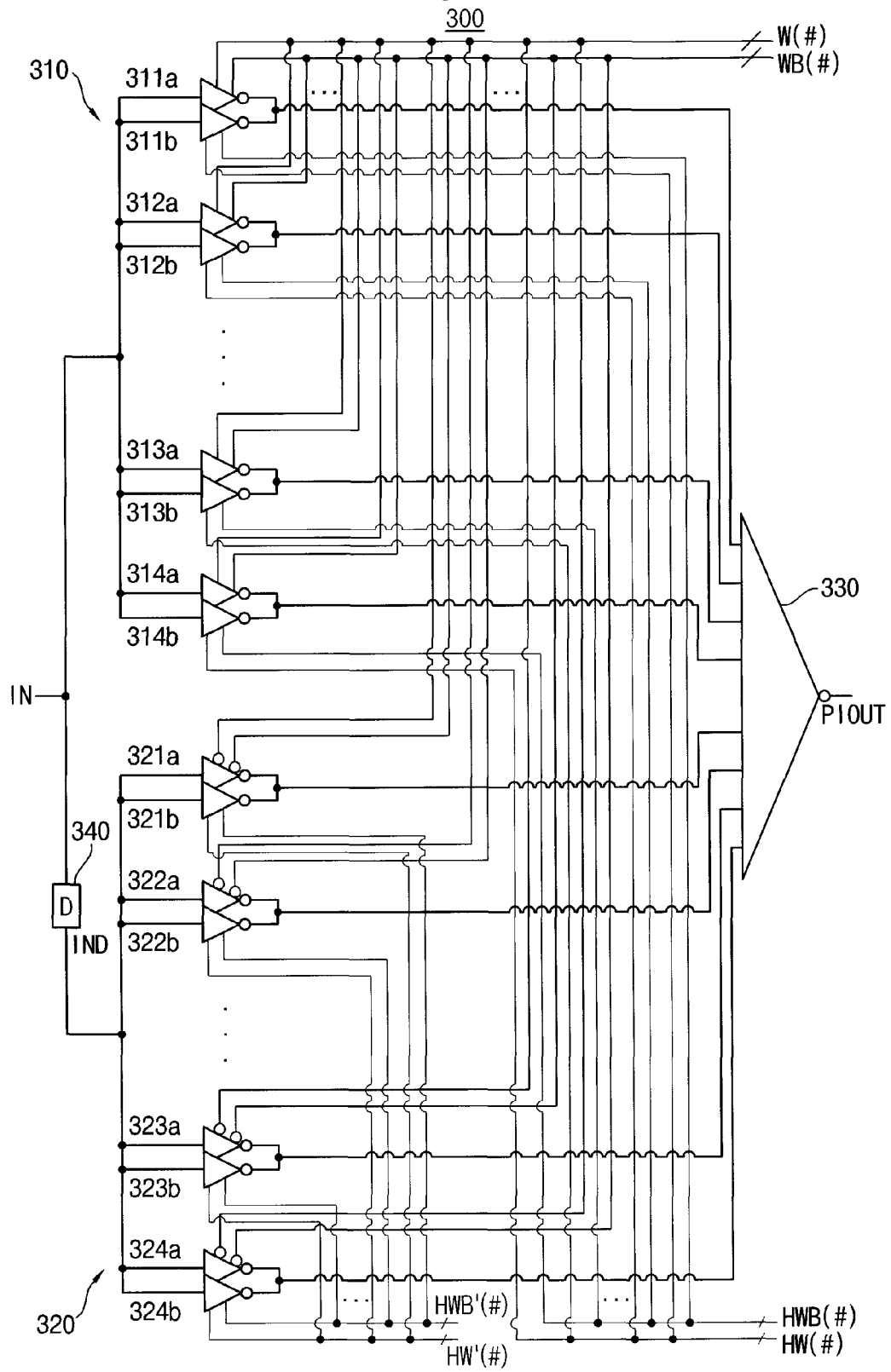
FIG. 3A is a circuit diagram illustrating an example of the phase interpolation driver of FIG. 1 or FIG. 2 according to some example embodiments.

FIG. 3A is a circuit diagram illustrating an example of the phase interpolation driver of FIG. 1 or FIG. 2 according to some example embodiments.

Referring to FIG. 3A, a phase interpolator 300 may include a first driver block 310 and a second driver block 320 operating complementarily with respect to each other, a delay circuit 340 and an output driver 330. The delay circuit delays an input signal IN to output a delayed input signal IND. The output driver 330 merges and inverts a plurality of output signals from the first and second driver blocks 310 and 320 to provide the interpolated output signal PIOUT.

The first driver block 310 includes a plurality of first drivers 311a~314a and a plurality of second drivers 311b~314b, and the second driver block 320 includes a plurality of first drivers 321a~324a and a plurality of second drivers 321b~324b. Each one of the first drivers 311a~314a and corresponding one of the second drivers 311b~314b may constitute a unit driver. That is, the first driver block 310 includes a plurality of unit drivers, each including one of the first drivers 311a~314a and corresponding one of the second drivers 311b~314b. In addition, the second driver block 320 includes a plurality of unit drivers, each including one of the first drivers 321a~324a and corresponding one of the second drivers 321b~324b. In addition, the first drivers 311a~314a of the first driver block 310 and the first drivers 321a~324a of the second driver block 320 may be referred to as a first set of drivers, and the second drivers 311b~314b of the first driver block 310 and the second drivers 321b~324b of the second driver block 320 may be referred to as a second set of drivers.

A number of the unit drivers included in each of the first and second driver blocks 310 and 320 may be varied according to precision of phase interpolation. The more precise phase interpolation, the greater is the number of the unit drivers included in each of the driver blocks 310 and 320.

For example, the number of the unit drivers included in each of the driver blocks 310 and 320 is determined based on how much interval of a fine lock which is set in a coarse lock is included. When the interval of the fine lock is determined to have sixteen intervals, sixteen unit drivers may be required in each of the driver blocks 310 and 320.

The input signal IN may include a clock signal. When two input signals having a regular delay difference are input in the coarse lock, the two input signals having the regular delay difference may be input without the delay circuit 340. When the one input signal IN is provided as illustrated in FIG. 3, the delay circuit 340 may be included for delaying the input signal IN to provide the delayed input signal IND. In addition, the input signals IN and IND may be selected from a delay line circuit based on a delay code.

Each unit driver includes one of the first drivers 311a~314a and 321a~324a and corresponding one of the second drivers 311b~314b and 321b~324b. The first drivers 311a~314a of the first driver block 310 are controlled by a first pair of control signals W(#) and WB(#), and the second drivers 311b~314b of the first driver block 310 are controlled by a second pair of control signals HW(#) and HWB(#). In addition, the first drivers 321a~324a of the second driver block 320 are controlled by inverted versions of the first pair of control signals W(#) and WB(#), and the second drivers 321b~324b of the second driver block 320 are controlled by a third pair of control signals HW'(#) and HWB'(#). For example, the inverted versions of the first pair of control signals W(#) and WB(#) may be generated in the second driver block 320 or may be input as inverted signals from outside the second driver block 320.

The first pair of control signals W(#) and WB(#) control on/off of the first drivers 311a~314a and 321a~324a. That is, the first drivers 311a~314a and 321a~324a are turned on/off only by the first pair of control signals W(#) and WB(#) without regard to the delay difference between the input signal IN and the delayed input signal IND (without regard to delay intervals in the coarse lock). Since the driver blocks 310 and 320 operate complementarily with regard to each other, total number of the first drivers 311a~314a and 321a~324a in driver blocks 310 and 320, which are turned on is same as a total number of the first drivers included one of the driver blocks 310 and 320. That is, outputs of the driver blocks 310 and 320 compete with respect to each other. Therefore, when one of the driver blocks 310 and 320 has more first drivers which are turned on, the phase of the interpolated output signal PIOUT follows a phase of one of the driver blocks 310 and 320 having more first drivers which are turned on.

As described above, the second drivers 311b~314b of the first driver block 310 are turned-on/off by the second pair of control signals HW(#) and HWB(#) according to the delay difference (phase difference) between the input signal IN and the delayed input signal IND. For example, when the delay difference between the input signal IN and the delayed input signal IND is greater than a reference value, the interpolated output signal PIOUT may have a more gentle slew rate by turning off the second drivers 311b~314b of the first driver block 310. For, example, when the delay difference between the input signal IN and the delayed input signal IND is not greater than the reference value, the interpolated output signal PIOUT may have steeper slew rate by turning on the second drivers 311b~314b. In addition, when the delay difference between the input signal IN and the delayed input signal IND is not greater than the reference value, the second drivers 311b~314b may be controlled by signals W(#) from the first pair of control signals W(#) and WB(#).

As described above, the second drivers 311b~314b of the first driver block 310 are turned-on/off by the third pair of control signals HW'(#) and HWB'(#) according to the delay difference (phase difference) between the input signal IN and the delayed input signal IND. For example, when the delay difference between the input signal IN and the delayed input signal IND is greater than a reference value, the interpolated output signal PIOUT may have a more gentle slew rate by turning off the second drivers 311b~314b. In addition, when the delay difference between the input signal IN and the delayed input signal IND is not greater than the reference value, the interpolated output signal PIOUT may have steeper slew rate by turning on the second drivers 311b~314b. When the delay difference between the input signal IN and the delayed input signal IND is not greater than the reference value, the second drivers 311b~314b may be controlled by signals WB(#) from the first pair of control signals W(#) and WB(#).

As described above, the phase interpolation driver 300 may selectively turning on/off the second drivers 311b~314b and 321b~324b in response to the second pair of control signals HW(#) and HWB(#) and the third pair of control signals HW'<#> and HWB'<#>, respectively, according to the delay difference between the input signal IN and the delayed input signal IND, and the interpolated output signal PIOUT may have linearity without regard to the delay difference between the input signal IN and the delayed input signal IND.

Figure 3B:
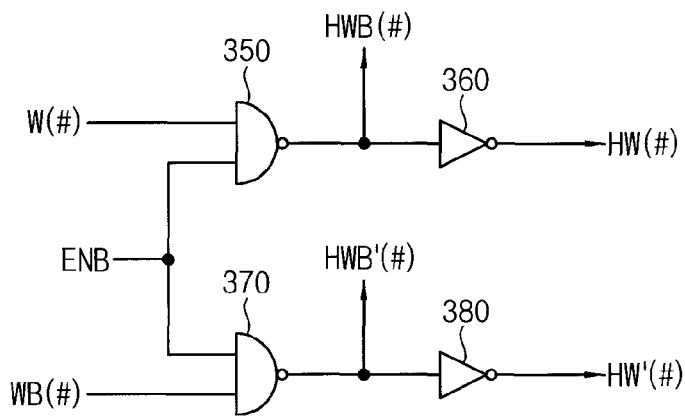
FIG. 3B is a logic circuit illustrating an example of generating control signals of FIG. 3A according to some example embodiments.

FIG. 3B is a logic circuit illustrating an example of generating control signals in FIG. 3A according to some example embodiments.

In FIG. 3B, a first NAND gate 350 receives W(#) and the output signal ENB of the delay difference detector, and outputs HWB(#). A first inverter 360 receives the HWB(#) and outputs HW(#). A second NAND gate 370 receives WB(#) and the output signal ENB of the delay difference detector, and outputs HWB'(#). A second inverter 380 receives the HWB'(#) and outputs HW'(#). For example, when the delay difference between two input signals of the phase interpolator is greater than a reference value, the output signal ENB may have logic "0". The levels of control signals HWB(#), HWB'(#), HW(#) and HW'(#) may turn off all of a plurality of second drivers 311b~314b and 321b~324b. In addition, when the delay difference between two input signals of the phase interpolator is not greater than the reference value, the output signal ENB may have logic "1". In this case, the levels of control signals HWB(#), HWB'(#), HW(#) and HW'(#) depend on the first pair of control signals W(#) and WB(#), respectively. Accordingly, a plurality of second drivers 311b~314b are controlled by control signals W(#) and a plurality of second drivers 321b~324b are controlled by control signals WB(#).

Figure 4:
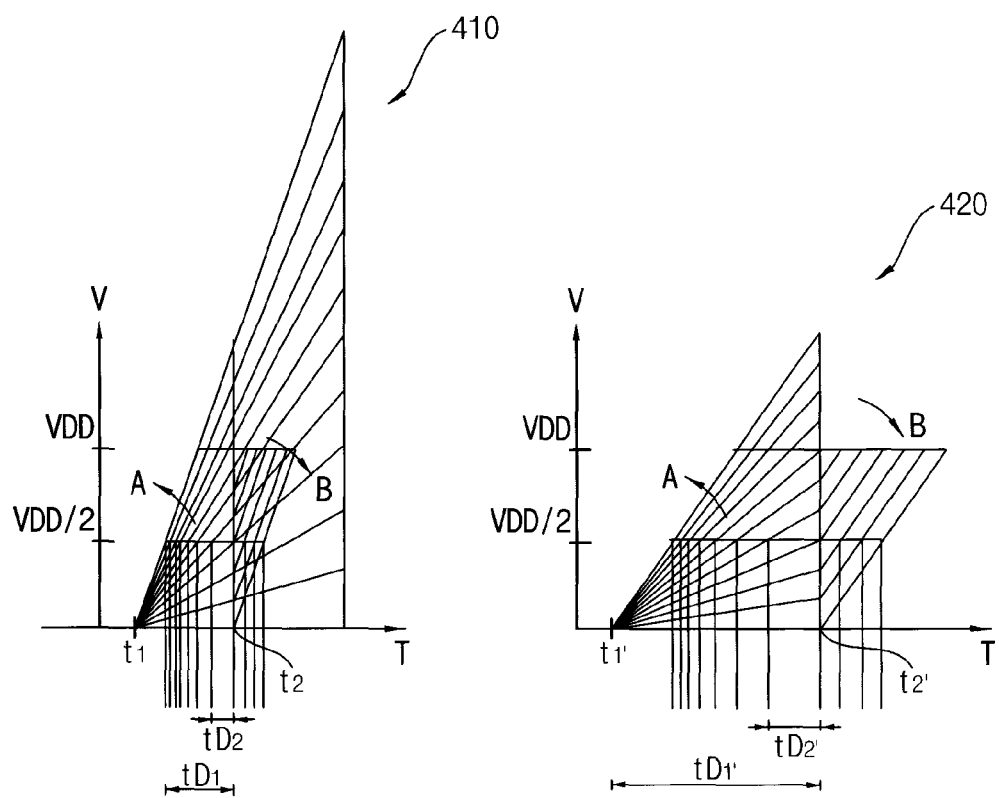
FIG. 4 is a timing diagram for explaining operation of the phase interpolation driver of FIG. 3.

FIG. 4 is a timing diagram for explaining operation of the phase interpolation driver of FIG. 3.

In FIG. 4, a reference numeral 410 illustrates a first case of an interpolated output signal PIOUT when a delay difference tD1 between the input signal IN and the delayed input signal IND is not greater than the reference value, and a reference numeral 420 illustrates a case when a delay difference tD1' between the input signal IN and the delayed input signal IND is greater than the reference value. Times tD2 and tD2' of the reference numeral 410 and the reference numeral 420 are a greatest difference in time between delay differences according to the number of turned on drivers of the first driver block 310 and second driver block 320, respectively.

Referring to FIG. 4, when the delay difference tD1 between the input signal IN and the delayed input signal IND is not greater than the reference value as illustrated by the reference numeral 410, the second drivers 311b~314b and 321b~324b are turned on based on the second pair of control signals HW(#) and HWB(#) and the third pair of control signals HW'(#) and HWB'(#), respectively. When the delay difference tD1' between the input signal IN and the delayed input signal IND is greater than the reference value, the second drivers 311b~314b and 321b~324b are turned off based on the second pair of control signals HW(#) and HWB(#) and the third pair of control signals HW'(#) and HWB'(#), respectively. Therefore, the interpolated output signal PIOUT has a linearity when delay difference tD1 and tD1' are different as illustrated by reference numerals 410 and 420.

In FIG. 4, legend A denotes a direction of the phase change of the interpolated output signal PIOUT when a number of the turned-on first drivers 311a~314a of the first driver block 310 is greater than a number of the turned-on first drivers 321a~324a of the second driver block 320. Legend B denotes a direction of the phase change of the interpolated output signal PIOUT when a number of the turned-on first drivers 311a~314a of the first driver block 310 is smaller than a number of the turned-on first drivers 321a~324a of the second driver block 320. In addition, t1 and t1' are controlled by the IN signal, and t2 and t2' are controlled by the IND signal.

Figure 5:
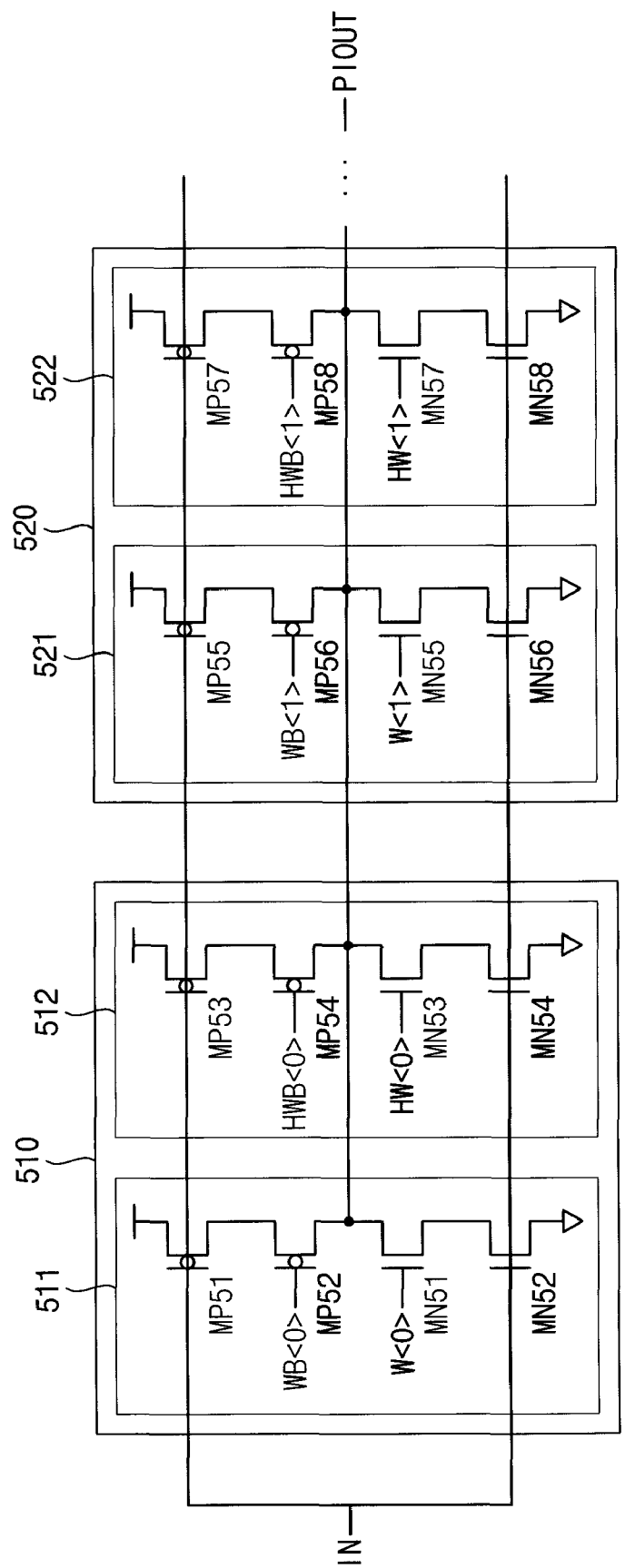
FIG. 5 is a circuit diagram illustrating an example of the unit driver of FIG. 3A according to some example embodiments.

FIG. 5 is a circuit diagram illustrating an example of the unit driver in FIG. 3A according to some example embodiments.

In FIG. 5, two unit drivers 510 and 520 corresponding to the unit driver in the first driver block 310 of FIG. 3A are illustrated, and the unit drivers 510 and 520 interpolate the input signal IN to provide the interpolated output signal PIOUT. In addition, the unit drivers in the second driver block 320 in FIG. 3A, which receives the delayed input signal IND are not illustrated for convenience of explanation.

The unit driver 510 includes a first driver 511 and a second driver 512. The first driver 511 includes four transistors MP51, MP52, MN51 and MN52 which are connected in series between a power supply voltage and a ground voltage. The transistors MP51 and MP52 are p-type metal-oxide semiconductor (PMOS) transistors, and the transistors MN51 and MN52 are n-type metal-oxide semiconductor (NMOS) transistors. The PMOS transistor MP51 has a gate receiving the input signal IN, the PMOS transistor MP52 has a gate receiving a weighted control signal WB<0>, and the NMOS transistor MN51 has a gate receiving a weighted control signal W<0> complementary with the weighted control signal WB<0>, and the NMOS transistor MN52 has a gate receiving the input signal IN. The first driver 511 is turned on/off in response to the weighted control signals WB<0> and W<0> without regard to the delay difference between input signal IN and the delayed input signal IND.

The second driver 512 includes four transistors MP53, MP54, MN53 and MN54 which are connected in series between the power supply voltage and the ground voltage. The transistors MP53 and MP54 are PMOS transistors, and the transistors MN53 and MN54 are NMOS transistors. The PMOS transistor MP53 has a gate receiving the input signal IN, the PMOS transistor MP54 has a gate receiving a driver strength control signal HWB<0>, and the NMOS transistor MN53 has a gate receiving a driver strength control signal HW<0> complementary with the driver strength control signal HW<0>, and the NMOS transistor MN54 has a gate receiving the input signal IN. The second driver 512 is turned on/off in response to the driver strength control signals HWB<0> and HW<0> according to the delay difference between input signal IN and the delayed input signal IND. For example, when the delay difference between the input signal IN and the delayed input signal IND is greater than the reference value, the second driver 512 may be turned off by setting driver strength control signals HWB<0> and HW<0> to logic high and logic low respectively. The PMOS transistor MP53 and the NMOS transistor MN54 operate as dummy load.

The unit driver 520 includes a first driver 521 and a second driver 522. The first driver 521 includes four transistors MP55, MP56, MN55 and MN56 which are connected in series between the power supply voltage and the ground voltage. The transistors MP55 and MP56 are PMOS transistors, and the transistors MN55 and MN55 are NMOS transistors. The PMOS transistor MP55 has a gate receiving the input signal IN, the PMOS transistor MP56 has a gate receiving a weighted control signal WB<1>, and the NMOS transistor MN55 has a gate receiving a weighted control signal W<1> complementary with the weighted control signal WB<1>, and the NMOS MN56 transistor has a gate receiving the input signal IN. The first driver 521 is turned on/off in response to the weighted control signals WB<1> and W<1> without regard to the delay difference between input signal IN and the delayed input signal IND.

The second driver 522 includes four transistors MP57, MP58, MN57 and MN58 which are connected in series between the power supply voltage and the ground voltage. The transistors MP57 and MP58 are PMOS transistors, and the transistors MN57 and MN58 are NMOS transistors. The PMOS transistor MP57 has a gate receiving the input signal IN, the PMOS transistor MP58 has a gate receiving a driver strength control signal HWB<1>, and the NMOS transistor MN57 has a gate receiving a driver strength control signal HW<1> complementary with the driver strength control signal HWB<1>, and the NMOS transistor MN58 has a gate receiving the input signal IN. The second driver 522 is turned on/off in response to the driver strength control signals HWB<1> and HW<1> according to the delay difference between input signal IN and the delayed input signal IND. For example, when the delay difference between the input signal IN and the delayed input signal IND is greater than the reference value, the second driver 522 may be turned off by setting driver strength control signals HWB<1> and HW<1> to logic high and logic low respectively. The PMOS transistor MP57 and the NMOS transistor MN58 operate as dummy load.

The weighted control signals W<0>, WB<0>, W<1> and WB<1> may include a thermometer code.

Figure 6:
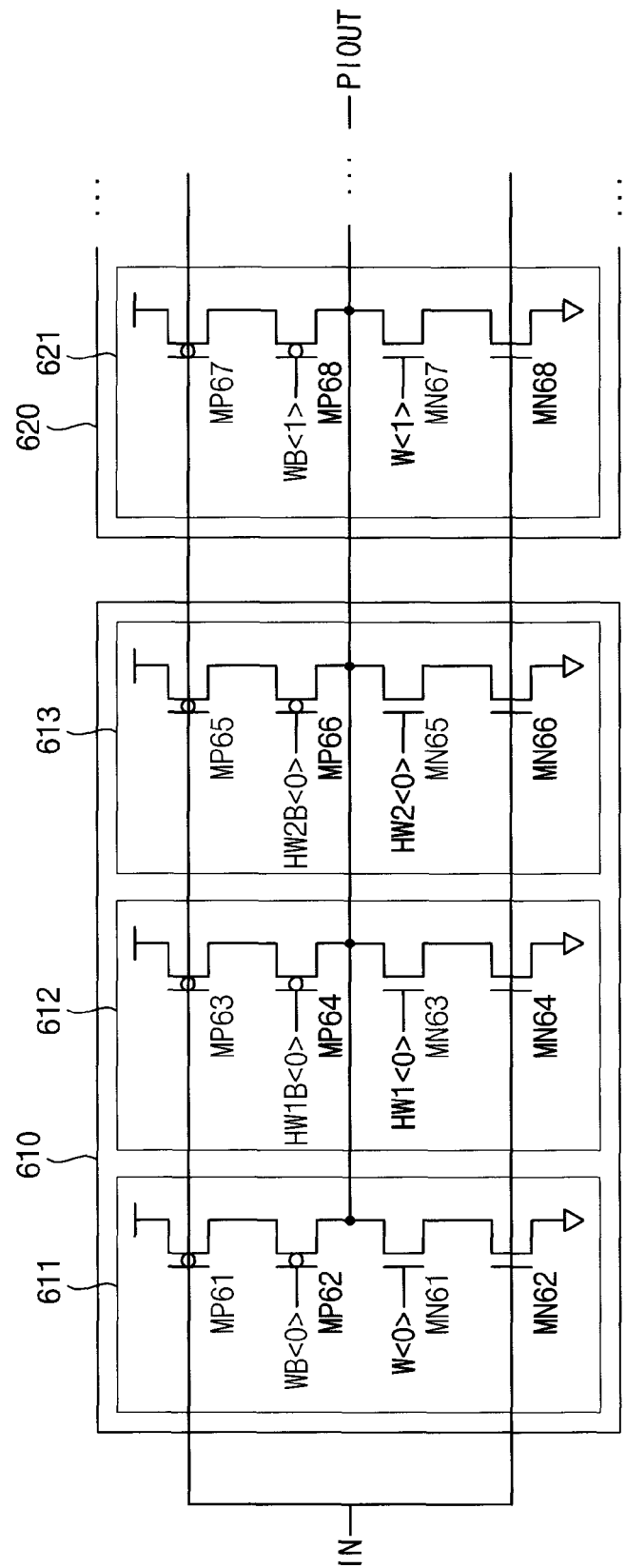
FIG. 6 is a circuit diagram illustrating another example of the unit driver of FIG. 3A according to some example embodiments.

FIG. 6 is a circuit diagram illustrating another example of the unit driver of FIG. 3A according to some example embodiments.

In FIG. 6, two unit drivers 610 and 620 corresponding to the unit driver in the first driver block 310 in FIG. 3A are illustrated, and the unit drivers 610 and 620 interpolate the input signal IN to provide the interpolated output signal PIOUT. In addition, the unit drivers in the second driver block 320 of FIG. 3, which receives the delayed input signal IND are not illustrated for convenience of explanation.

The unit driver 610 includes a first driver 611, a second driver 612 and a third driver 613. The first driver 611 includes four transistors MP61, MP62, MN61 and MN62 which are connected in series between the power supply voltage and the ground voltage. The transistors MP61 and MP62 are PMOS transistors, and the transistors MN61 and MN62 are NMOS transistors. The PMOS transistor MP61 has a gate receiving the input signal IN, the PMOS transistor MP62 has a gate receiving a weighted control signal WB<0>, and the NMOS transistor MN61 has a gate receiving a weighted control signal W<0> complementary with the weighted control signal WB<0>, and the NMOS transistor NM62 has a gate receiving the input signal IN. The first driver 611 is turned on/off in response to the weighted control signals WB<0> and W<0> without regard to the delay difference between input signal IN and the delayed input signal IND.

The second driver 612 includes four transistors MP63, MP64, MN63 and MN64 which are connected in series between the power supply voltage and the ground voltage. The transistors MP63 and MP64 are PMOS transistors, and the transistors MN63 and MN64 are NMOS transistors. The PMOS transistor MP63 has a gate receiving the input signal IN, the PMOS transistor MP64 has a gate receiving a driver strength control signal HW1B<0>, and the NMOS transistor MN63 has a gate receiving a driver strength control signal HW1<0> complementary with the driver strength control signal HW1B<0>, and the NMOS transistor MN64 has a gate receiving the input signal IN. The second driver 612 is turned on/off in response to the driver strength control signals HW1B<0> and HW1<0> according to the delay difference between input signal IN and the delayed input signal IND.

The third driver 613 includes four transistors MP65, MP66, MN65 and MN66 which are connected in series between the power supply voltage and the ground voltage. The transistors MP65 and MP66 are PMOS transistors, and the transistors MN65 and MN66 are NMOS transistors. The PMOS transistor MP65 has a gate receiving the input signal IN, the PMOS transistor MP66 has a gate receiving a driver strength control signal HW2B<0>, and the NMOS transistor MN65 has a gate receiving a driver strength control signal HW2<0> complementary with the driver strength control signal HW2B<0>, and the NMOS transistor MN65 has a gate receiving the input signal IN. The third driver 613 is turned on/off in response to the driver strength control signals HW2B<0> and HW2<0> according to the delay difference between input signal IN and the delayed input signal IND. For example, the driver strength control signals HW2B<0> and HW2<0> may be generated further based on the driver strength control signals HW1B<0> and HW1<0>.

The unit driver 620 includes a first driver 621, a second driver and a third driver which are not illustrated. The first driver 621 includes four transistors MP67, MP68, MN67 and MN68 which are connected in series between the power supply voltage and the ground voltage. The transistors MP67 and MP68 are PMOS transistors, and the transistors MN67 and MN68 are NMOS transistors. The PMOS transistor MP67 has a gate receiving the input signal IN, the PMOS transistor MP68 has a gate receiving a weighted control signal WB<1>, and the NMOS transistor MN67 has a gate receiving a weighted control signal W<1> complementary with the weighted control signal WB<1>, and the NMOS transistor NM68 has a gate receiving the input signal IN. The first driver 621 is turned on/off in response to the weighted control signals WB<1> and W<1> without regard to the delay difference between input signal IN and the delayed input signal IND.

In an example embodiment of FIG. 5, the unit driver 510 includes the first and second drivers 511 and 512, and the first driver 511 performs low frequency operation when the delay difference between the input signal IN and the delayed input signal IND is greater than the reference value. In addition, when the delay difference between the input signal IN and the delayed input signal IND is not greater than the reference value, the first and second drivers 511 and 512 perform high frequency operation by turning on the first and second drivers 511 and 512.

In an example embodiment of FIG. 6, the unit driver 610 includes the first, second and third drivers 611, 612 and 613. Therefore, the first driver 611 performs low frequency operation when a first delay difference between the input signal IN and the delayed input signal IND is greater than the reference value. The first and second drivers 611 and 612 perform middle frequency operation when a second delay difference between the input signal IN and the delayed input signal IND is not greater than the reference value by turning on the first and second drivers 611 and 612. The first, second and third drivers 611, 612 and 613 perform high frequency operation when a third delay difference between the input signal IN and the delayed input signal IND is not greater than the reference value and second delay time difference.

In example embodiments of FIGS. 5 and 6, the unit driver includes two or three drivers. In other example embodiments, four or more drivers may be included in the unit driver, and the four or more drivers may be controlled by weighted control signal using thermocode.

Figure 7:
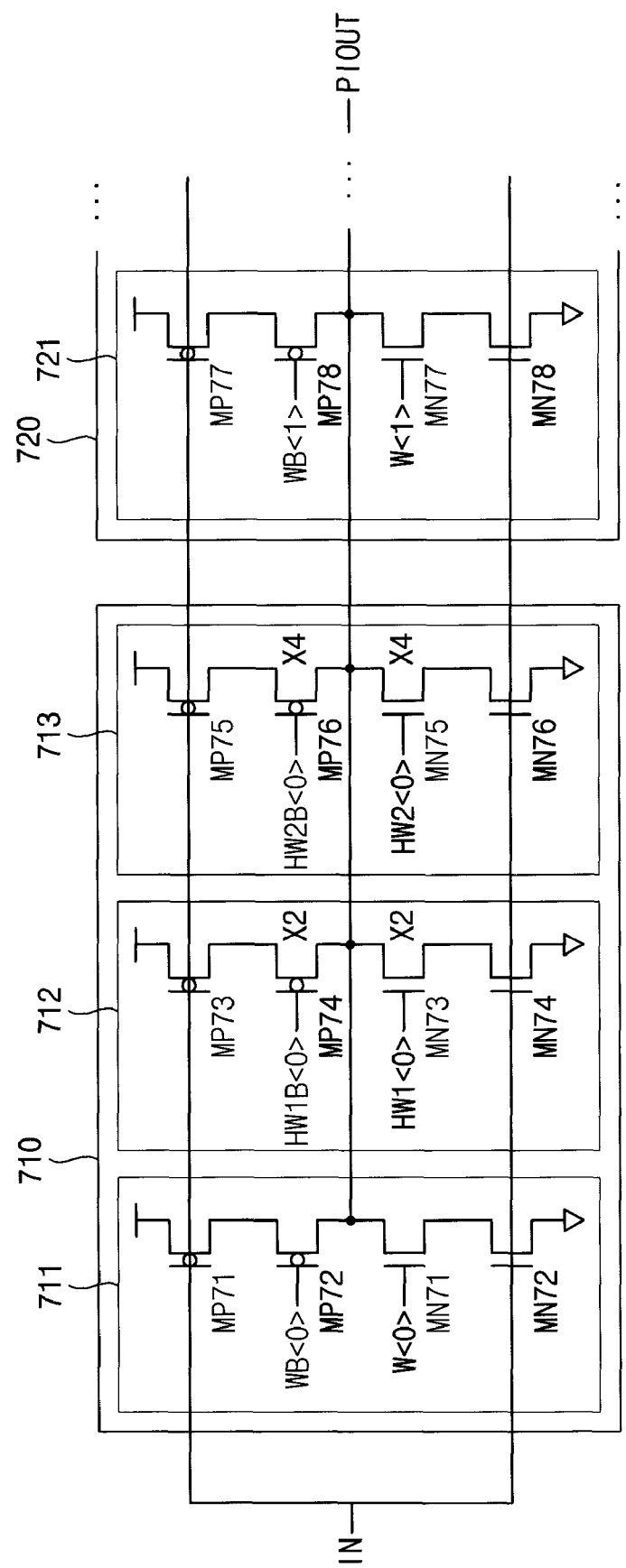
FIG. 7 is a circuit diagram illustrating another example of the unit driver of FIG. 3A according to some example embodiments.

FIG. 7 is a circuit diagram illustrating another example of the unit driver of FIG. 3A according to some example embodiments.

In FIG. 7, two unit drivers 710 and 720 corresponding to the unit driver in the first driver block 310 in FIG. 3A are illustrated, and the unit drivers 710 and 720 interpolate the input signal IN to provide the interpolated output signal PIOUT. In addition, the unit drivers in the second driver block 320 in FIG. 3A, which receives the delayed input signal IND are not illustrated for convenience of explanation.

The unit driver 710 includes a first driver 711, a second driver 712 and a third driver 713. The first driver 711 includes four transistors MP71, MP72, MN71 and MN72 which are connected in series between the power supply voltage and the ground voltage. The transistors MP71 and MP72 are PMOS transistors, and the transistors MN71 and MN72 are NMOS transistors. The PMOS transistor MP71 has a gate receiving the input signal IN, the PMOS transistor MP72 has a gate receiving a weighted control signal WB<0>, and the NMOS transistor MN71 has a gate receiving a weighted control signal W<0> complementary with the weighted control signal WB<0>, and the NMOS transistor NM72 has a gate receiving the input signal IN. The first driver 711 is turned on/off in response to the weighted control signals WB<0> and W<0> without regard to the delay difference between input signal IN and the delayed input signal IND.

The second driver 712 includes four transistors MP73, MP74, MN73 and MN74 which are connected in series between the power supply voltage and the ground voltage. The transistors MP73 and MP74 are PMOS transistors, and the transistors MN73 and MN74 are NMOS transistors. The PMOS transistor MP73 has a gate receiving the input signal IN, the PMOS transistor MP74 has a gate receiving a driver strength control signal HW1B<0>, and the NMOS transistor MN73 has a gate receiving a driver strength control signal HW1<0> complementary with the driver strength control signal HW1B<0>, and the NMOS transistor MN74 has a gate receiving the input signal IN. The second driver 712 is turned on/off in response to the driver strength control signals HW1B<0> and HW1<0> according to the delay difference between input signal IN and the delayed input signal IND.

The third driver 713 includes four transistors MP75, MP76, MN75 and MN76 which are connected in series between the power supply voltage and the ground voltage. The transistors MP75 and MP76 are PMOS transistors, and the transistors MN75 and MN76 are NMOS transistors. The PMOS transistor MP75 has a gate receiving the input signal IN, the PMOS transistor MP76 has a gate receiving a driver strength control signal HW2B<0>, and the NMOS transistor MN75 has a gate receiving a driver strength control signal HW2<0> complementary with the driver strength control signal HW2B<0>, and the NMOS transistor MN75 has a gate receiving the input signal IN. The third driver 713 is turned on/off in response to the driver strength control signals HW2B<0> and HW2<0> according to the delay difference between input signal IN and the delayed input signal IND.

The unit driver 720 includes a first driver 721, a second driver and a third driver which are not illustrated. The first driver 721 includes four transistors MP77, MP78, MN77 and MN78 which are connected in series between the power supply voltage and the ground voltage. The transistors MP77 and MP78 are PMOS transistors, and the transistors MN77 and MN78 are NMOS transistors. The PMOS transistor MP77 has a gate receiving the input signal IN, the PMOS transistor MP78 has a gate receiving a weighted control signal WB<1>, and the NMOS transistor MN77 has a gate receiving a weighted control signal W<1> complementary with the weighted control signal WB<1>, and the NMOS transistor NM78 has a gate receiving the input signal IN. The first driver 721 is turned on/off in response to the weighted control signals WB<1> and W<1> without regard to the delay difference between input signal IN and the delayed input signal IND.

In an example embodiment of FIG. 6, each of the first to third drivers 611, 612 and 613 has a same driving capability with respect from each other, and the first to third drivers 611, 612 and 613 are driven by thermometer code. However, in an example embodiment of FIG. 7, each of the first to third drivers 711, 712 and 713 has a different driving capability with respect to each other. For example, when the first driver 711 has a driving capability corresponding to "one", the second driver 712 may have a driving capability corresponding to "two" and the third driver 713 may have a driving capability corresponding to "four". Each of the transistors MP71, MP72, MN71 and MN72 of the first driver 711 may have a size corresponding to "one", each of the transistors MP73, MP74, MN73 and MN74 of the second driver may have a size corresponding to "two" with respect from each of the transistors MP71, MP72, MN71 and MN72 of the first driver 711, and each of the transistors MP75, MP76, MN75 and MN76 may have a size corresponding to "four" with respect to each of the transistors MP71, MP72, MN71 and MN72 of the first driver 711. The driver strength control signal HW1<0>, HW1B<0>, HW2<0> and HW2B<0> may include binary code.

Figure 8:
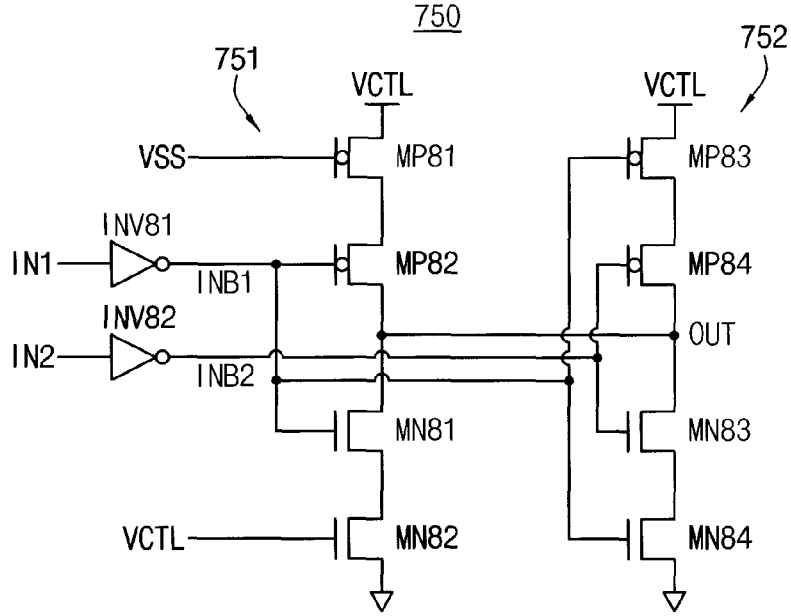
FIG. 8 is a circuit diagram illustrating an example of a unit driver for increasing linearity according to some example embodiments.

FIG. 8 is a circuit diagram illustrating an example of a unit driver for increasing linearity according to some example embodiments.

Referring to FIG. 8, a unit driver 750 may include inverters INV81 and INV82, a first driver 751 and a second driver 752. The first driver 751 includes four transistors MP81, MP82, MN81 and MN82 which are connected in series between a voltage terminal VCTL having a predetermined level and a ground voltage, and the second driver 752 includes four transistors MP83, MP84, MN83 and MN84 which are connected in series between the voltage terminal VCTL the ground voltage. The inverter INV81 inverts an input signal IN1 to output an inverted input signal INB1. The inverter INV82 inverts an input signal IN2 to output an inverted input signal INB2.

The PMOS transistor MP81 has a gate connected to the ground voltage VSS, and the PMOS transistor is always turned on. The PMOS transistor MP82 has a gate receiving the inverted input signal INB1, and the NMOS transistor MN81 has a gate receiving the inverted input signal INB1. The NMOS transistor MN82 has a gate connected to the voltage terminal VCTL, and the NMOS transistor MN82 is always turned on. The PMOS transistor MP83 has a gate receiving the inverted input signal INB1, the PMOS transistor MP84 has a gate receiving the inverted input signal INB2, the NMOS transistor MN83 has a gate receiving the inverted input signal INB2, and the NMOS transistor has a gate receiving the inverted input signal INB1.

For example, assume that the inverted input signals INB1 and INB2 transition from logic low level to logic high level. When the inverted input signals INB1 and INB2 have logic low level, an output node OUT is precharged to a voltage level of VCTL. When the inverted input signal INB1 transitions to logic high level, the PMOS transistors MP82 and MP83 are turned off, and the NMOS transistors MN81 and MN84 are turned on. Therefore, the output node OUT is discharged while a current having a magnitude of I flows from the output node OUT to the ground voltage in the first driver 751. When the inverted input signal INB2 transitions to logic high level, the PMOS transistor MP84 is turned off, and the NMOS transistor MN83 is turned on. Therefore, a current having a magnitude of I also flows from the output node OUT to the ground voltage in the second driver 752. Accordingly, when inverted input signals INB1 and INB2 transition to logic high level, a total current having a magnitude of 2I flows from the output node OUT to the ground voltage in the unit driver 750. Therefore, the unit driver 750 may perform a linear phase interpolation on the input signal IN1 and IN2.

For example, assume that the inverted input signals INB1 and INB2 transition from logic high level to logic low level. When the inverted input signals INB1 and INB2 have logic high level, an output node OUT is discharged to a voltage level of VSS. When the inverted input signal INB1 transitions to logic low level, the NMOS transistors MN81 and MN84 are turned off, and the PMOS transistors MP82 and MP83 are turned on. Therefore, the output node OUT is charged while a current having a magnitude of I flows from the voltage terminal to the output node OUT in the first driver 751. When the inverted input signal INB2 transitions to logic low level, the PMOS transistor MP84 is turned on, and the NMOS transistor MN83 is turned off. Therefore, a current having a magnitude of I also flows from the voltage terminal to the output node OUT in the second driver 752. Accordingly, when inverted input signals INB1 and INB2 transition to logic low level, a total current having a magnitude of 2I flows from the voltage terminal to the output node OUT in the unit driver 750, and the output node OUT is charged to a voltage level of VCTL. Therefore, the unit driver 750 may perform a linear phase interpolation on the input signal IN1 and IN2. The voltage terminal VCTL is denoted as "VCTL", because control voltage of the PLL or DLL may be used as the voltage terminal VCTL. A power supply voltage VDD also may be used as the voltage terminal VCTL.

The unit driver 750 of FIG. 8 prevents short circuit current from being generated in the output node OUT when the input signals IN1 and IN2 transition from logic low level to logic high level or transition from logic high level to logic low level, and thereby increasing linearity. Therefore, the unit driver 750 may be referred to as clocked CMOS multiplexer.

Figure 9:
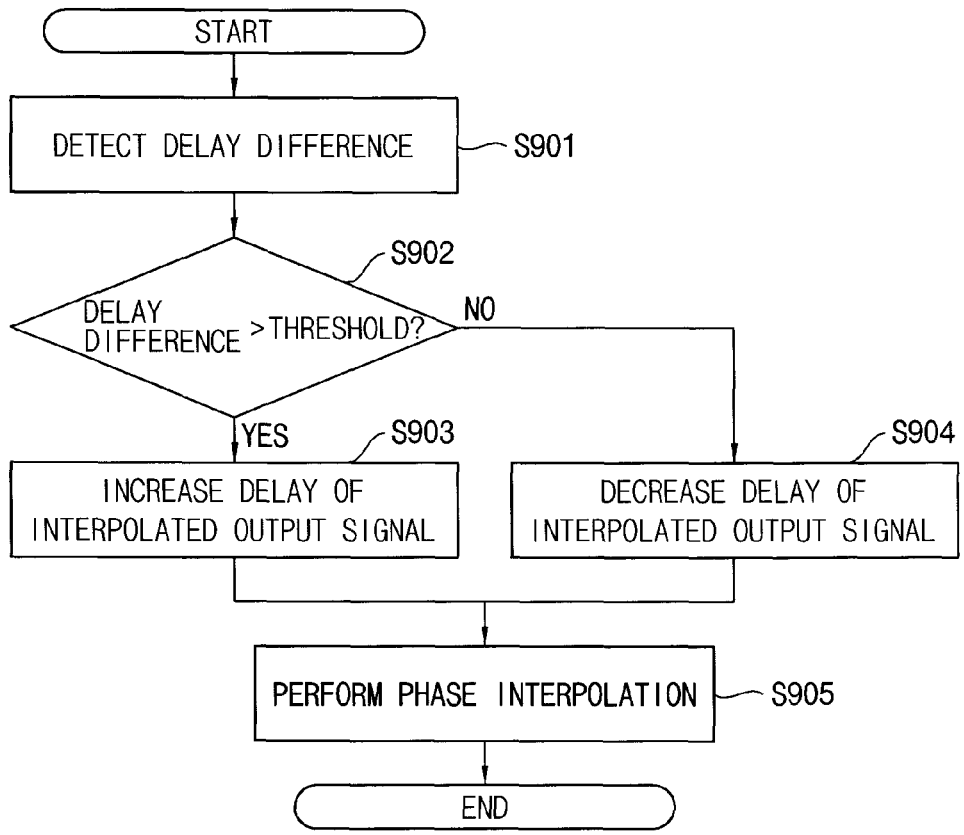
FIG. 9 is a flow chart illustrating a phase interpolating method according to some example embodiments.

FIG. 9 is a flow chart illustrating a phase interpolating method according to some example embodiments.

Hereinafter, there will be description on a phase interpolating method with reference to FIGS. 1, 2, 3A and 9.

Phase delay difference between two input signals such as the input signal IN and the delayed input signal IND is detected (S901). The two input signals are signals which are used for phase interpolation, and the two input signals may correspond to each of upper limit and lower limit in a particular interval which is determined after coarse lock is performed. The delay difference between two input signals may be generated based on a delay code and the delay code may include delay difference information of each driver. Alternatively, the delay code may be detected in step S901 instead of the delay difference between two input signals such as the input signal IN and the delayed input signal IND. The detected phase delay difference is compared with a reference value (or a threshold value) (S902). When the phase delay difference is greater than the threshold value (YES in S902 step), delay of interpolated output signal PIOUT is increased, or driver ability of interpolation driver is decreased, for example, by turning off the plurality of second drivers 311b~314b of the first driver block 310 and plurality of second drivers 321b~324b of the second driver block 320 (S903). The driver strength control circuit 130 or 230 can output control signals to turn off the plurality of second drivers 311b~314b of the first driver block 310 and plurality of second drivers 321b~324b of the second driver block 320. In addition, when the capacitive load control circuit 260 outputs a control signal to turn on the switch SW of the capacitive load 240, the interpolated output signal PIOUT may have gentle slew rate. When the phase delay difference is not greater than the threshold value (NO in S901 step), delay of interpolated output signal PIOUT is decreased or driver ability of interpolation driver is increased by turning on the plurality of second drivers 311b~314b of the first driver block 310 and plurality of second drivers 321b~324b of the second driver block 320 (S904). As such, interpolation may include performing phase interpolation on two input signals by controlling the phase interpolation driver 220 and/or the capacitive load 240 (S905). Therefore, linearity of the interpolated output signal PIOUT may be increased by adjusting delays of the input signals according to the phase delay difference between the input signals.

Figure 10:
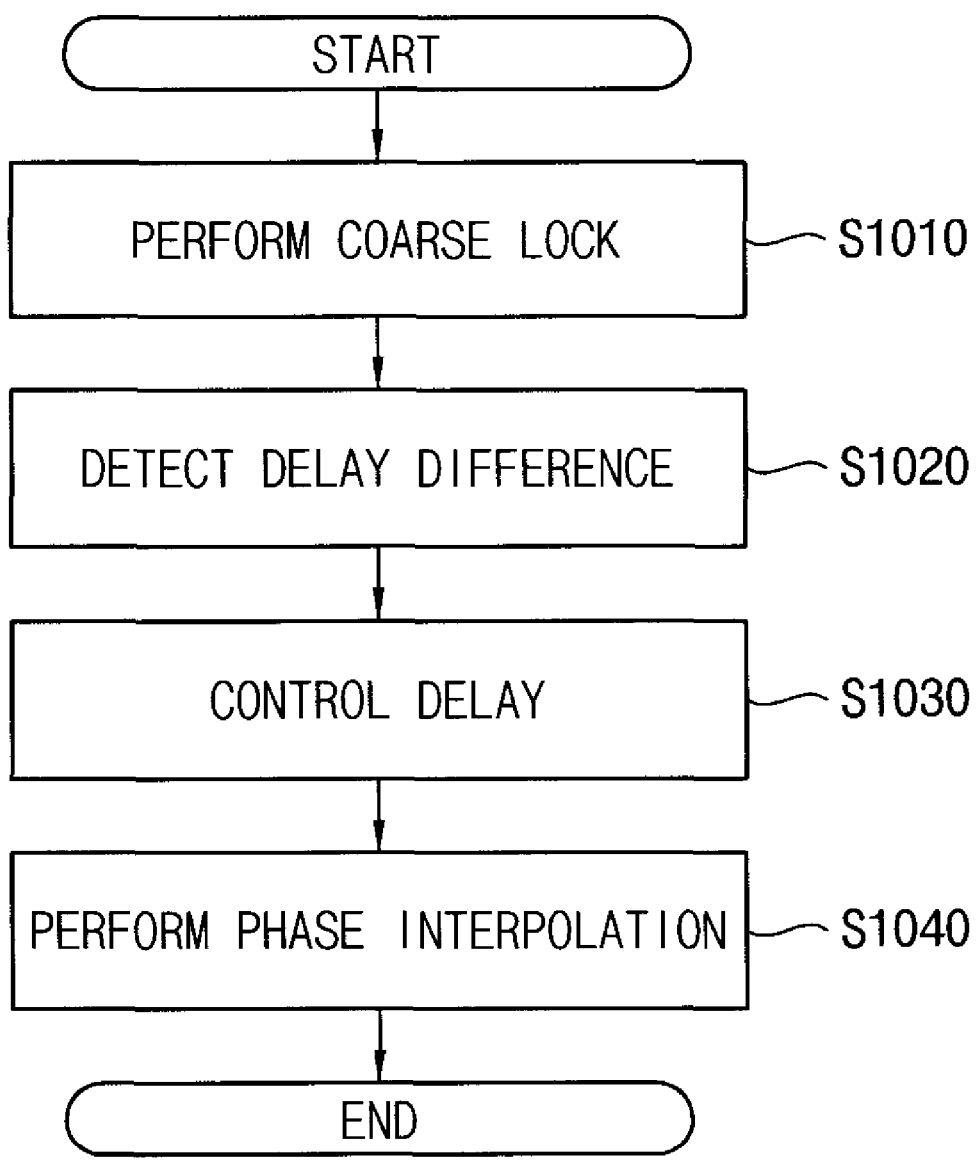
FIG. 10 is a flow chart illustrating a delay locked-loop (DLL) operating method according to some example embodiments.

FIG. 10 is a flow chart illustrating a delay locked-loop (DLL) operating method according to some example embodiments.

Referring to FIG. 10, a coarse lock is performed. (S1010). Through the coarse lock, phases between a feedback signal though a DLL loop and a clock signal is compared, and the coarse lock is performed for determining a particular interval of a delay line based on the comparison. Phase delay difference between two input signals is detected through the coarse lock (S1020). The two input signals are input to a phase interpolator for phase interpolation. Delay of interpolated output signal is adjusted according to the detected phase delay difference (S1030). Delay of interpolated output signal may be adjusted by adjusting driver strength of a phase interpolation driver or by varying capacitance of an output terminal at which the interpolated output signal is provided. Normal phase interpolation is performed (S1040). The fine lock is performed through the phase interpolation, and the fine lock information is repeated in comparing the phase of the feedback signal though a DLL loop and the clock signal. As a result, the feedback signal though a DLL loop locked with the clock signal.

Figure 11:
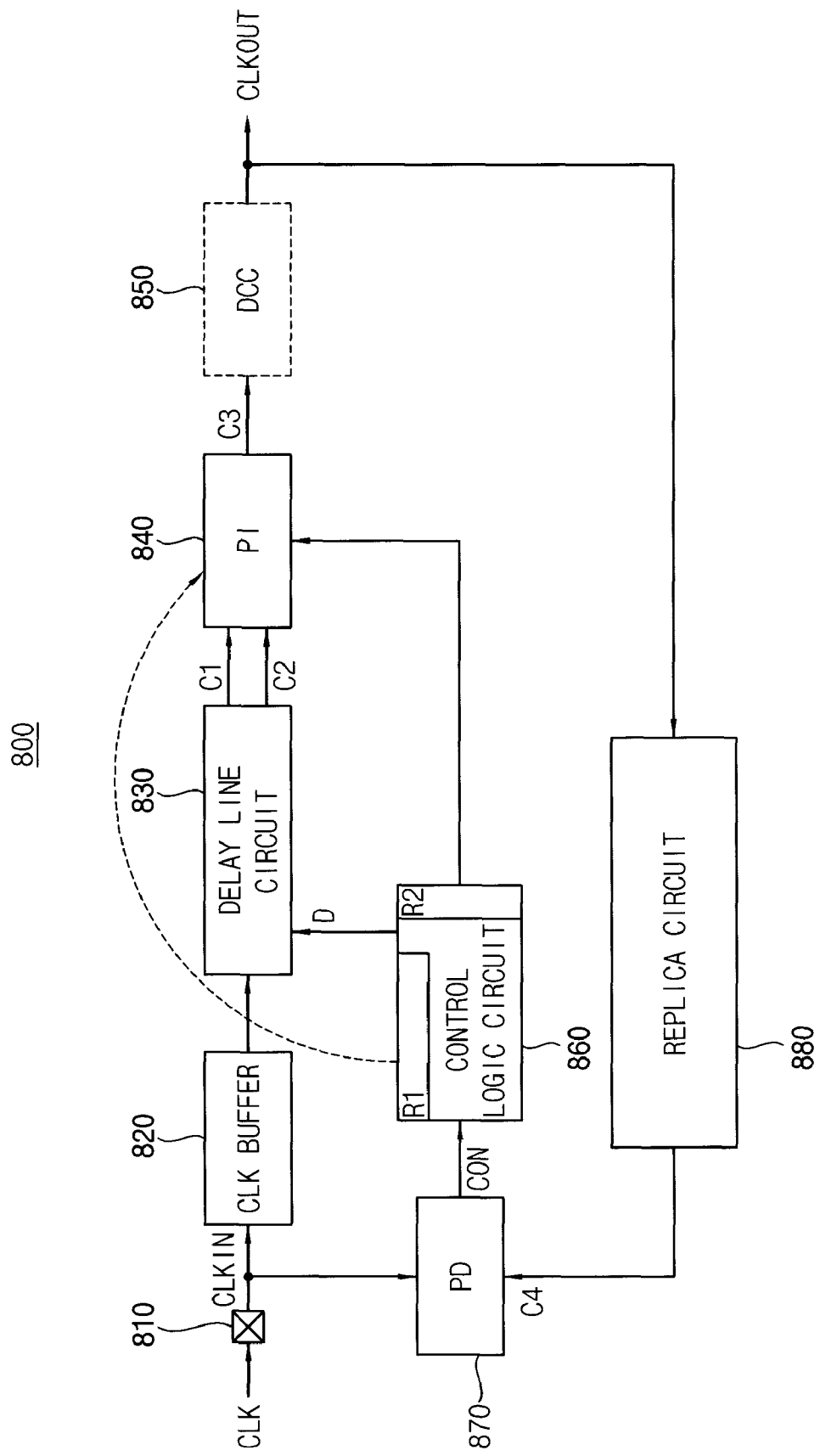
FIG. 11 is a circuit diagram illustrating a DLL circuit including the phase interpolator according to some example embodiments.

FIG. 11 is a circuit diagram illustrating a DLL circuit including the phase interpolator according to some example embodiments.

Referring to FIG. 11, a DLL circuit 800 may include a clock buffer 820 receiving a clock signal CLKIN, a delay line circuit 830, a phase interpolator 840, a phase detector 870, a control logic circuit 860 and a replica circuit 880. The DLL circuit 800 may further include a duty cycle corrector 850.

An external clock signal CLK is input through a clock pad 810 as the clock signal CLKIN, and the clock buffer 820 buffers the clock signal CLKIN. The delay line 830 includes a plurality of delay cells, and delays the clock signal CLKIN to provide delayed clock signals C1 and C2. The phase detector 870 detects a phase difference between the clock signal CLKIN and a feedback clock signal C4 from the replica circuit 880. The replica circuit 880 has a same delay condition as a real clock path connected to data output terminal of a memory device. The control logic circuit 860 receives a phase difference information CON from the phase detector 870, and controls the delay line circuit 830 and the phase interpolator 840 for selecting a phase and control for coarse lock and a fine lock. The phase interpolator 840 interpolates a coarse lock signal to determine the fine lock based on coarse lock information from the delay line circuit 830 and control of the control logic circuit 860. The duty cycle corrector 850 may correct duty cycle of an output signal C3 which is delay-locked in the phase interpolator 850 to provide an output clock signal CLKOUT to the replica circuit 880.

The control logic circuit 860 generates weighted control signals or binary control signals and stores the weighted control signals and the binary control signals in an internal register R1. In addition, the control logic circuit 860 generates control signals for controlling a connection between the capacitive load 240 and the output terminal NO or for controlling driving strength of the phase interpolation driver 120 or 220, and stores the control signals in another register R2.

The phase interpolator 840 interpolates the clock signals C1 and C2 having different phase with respect to each other to generate a clock signal C3 having a phase between the phases of the clock signals C1 and C2. The phase interpolator 840 may interpolate the clock signals C1 and C2 to generate the clock signal C3 by using weighted control signals controlling two or more driver blocks operating complementarily with respect to each other. The weighted control signals may include thermometer codes or binary codes. The phase interpolator 840 may employ the phase interpolator illustrated with reference to FIGS. 3A through 8.

The replica circuit 880 includes a circuit having a same delay condition as a real clock path to the data output terminal of the memory device, and the clock signal C3 is delivered to the data output terminal of the memory device through the real clock path.

The phase detector 870 compares phases of the clock signal CLKIN and the feedback clock signal C4 from the replica circuit 880 to provide the control logic circuit 860 with a phase detection result signal CON representing phase comparison of the clock signal CLKIN and the feedback clock signal C4.

The control logic circuit 860 determines delay amount (UP/DN) of the delay line circuit 830 in response to the phase detection result signal CON, and controls the delay amount of the delay line circuit 830. For example, the control logic circuit 860 may select the clock signals C1 and C2 having smallest phase difference with respect to the clock signal CLKIN of clock signals which passed through delay cells of the delay line by using a control signal D. The control signal D may include a delay code having coarse lock information.

The DLL circuit 800 may lock with the external clock signal CLK the output clock signal CLKOUT which is used at the data input/output terminal of the memory device by adjusting delay amount of the delay line circuit 830 based on a phase difference between the clock signal CLKIN and the feedback clock signal C4 and locking the delayed clock signal.

Figure 12:
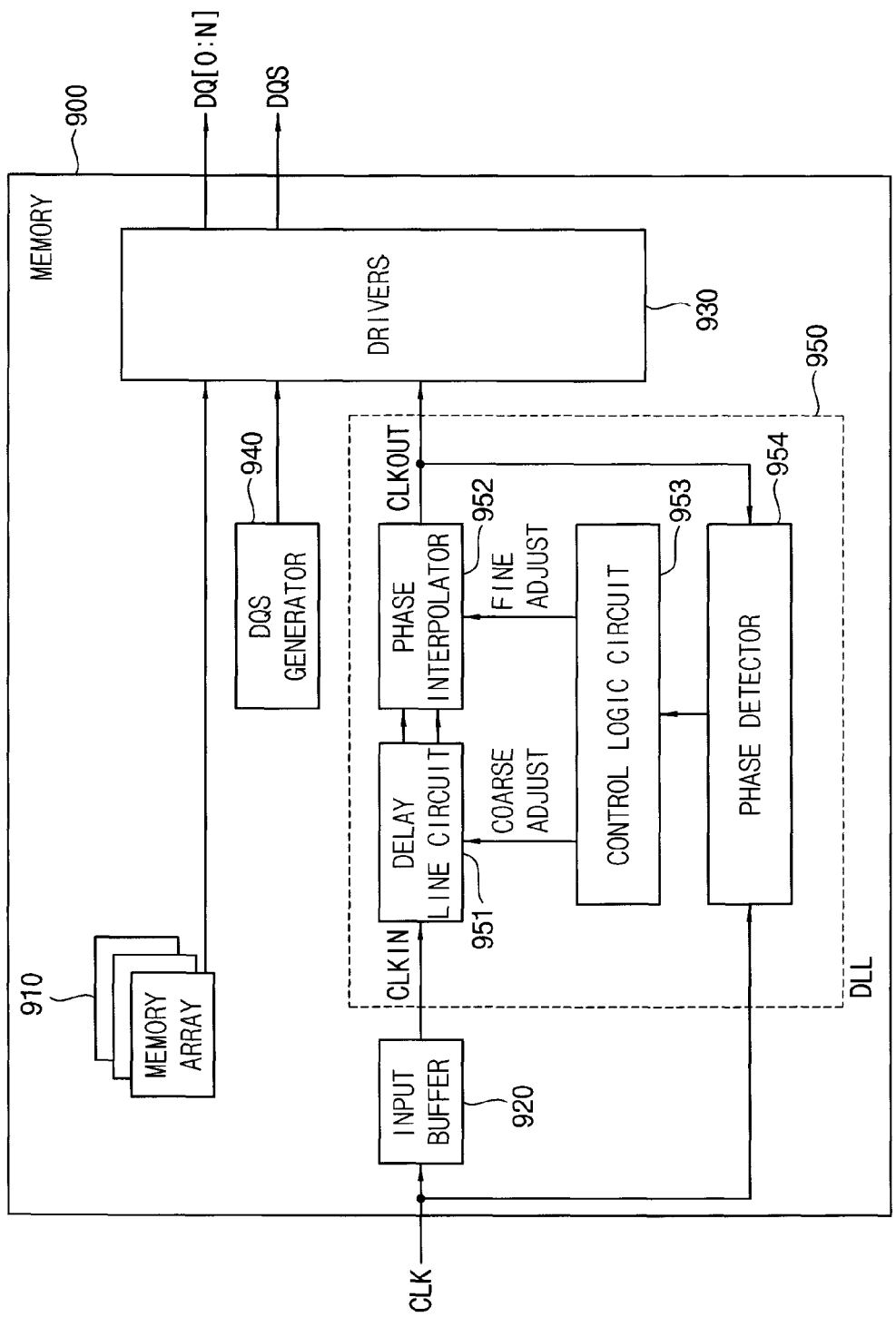
FIG. 12 a block diagram illustrating a memory including the DLL circuit according to some example embodiments.

FIG. 12 is a block diagram illustrating a memory including the DLL circuit according to some example embodiments.

Referring to FIG. 12, a memory 900, for example a DRAM, includes a memory cell array 910, an input buffer 920, data input/output drivers 930, a data strobe signal (DQS) generator 940 and a DLL circuit 950.

Data strobe signal DQS is a signal representing valid data interval, and the data strobe signal DQS must be synchronized with an external clock signal CLK. "DQ[0:N]" represents data output lines.

The input buffer 920 buffers an external clock signal CLK to provide an internal clock signal CLKIN.

The DLL circuit 950 includes a delay line circuit 951, a phase interpolator 952, a control logic circuit 953, and a phase detector 954. Since each operation of the delay line circuit 951, the phase interpolator 952, the control logic circuit 953, and the phase detector 954 is substantially the same as each operation of the delay line 830, the phase interpolator 840, the control logic circuit 860 and the phase detector 870, detailed description of each operation of the delay line circuit 951, the phase interpolator 952, the control logic circuit 953, and the phase detector 954 will be omitted. In FIG. 12, control of the control logic circuit 953 over the delay line circuit 951 is represented as "COARSE ADJUST", and control of the control logic circuit 953 over the phase interpolator 952 is represented as "FINE ADJUST".

In one embodiment, data are transferred through that data input/output drivers 930 and the data input/out lines DQ[0:N] by synchronizing the data signal DQ or the data strobe signal DQS with the external clock signal CLK. The DLL circuit 950 may lock the output clock signal CLKOUT to the external clock signal CLK by delaying the internal clock signal CLKIN by a predetermined delay time considering all delays that may be generated in a clock tree.

The memory 900 may be, for example a semiconductor memory device that includes resistive memories such as Phase Change Random Access Memory (PRAM) and Resistance Random Access Memory (RRAM), Nano Floating Gate Memory (NFGM), Polymer Random Access Memory (PoRAM), Magnetic Random Access Memory (MRAM), Ferroelectric Random Access Memory (FRAM), NAND flash memory, or NOR flash memory.

Figure 13:
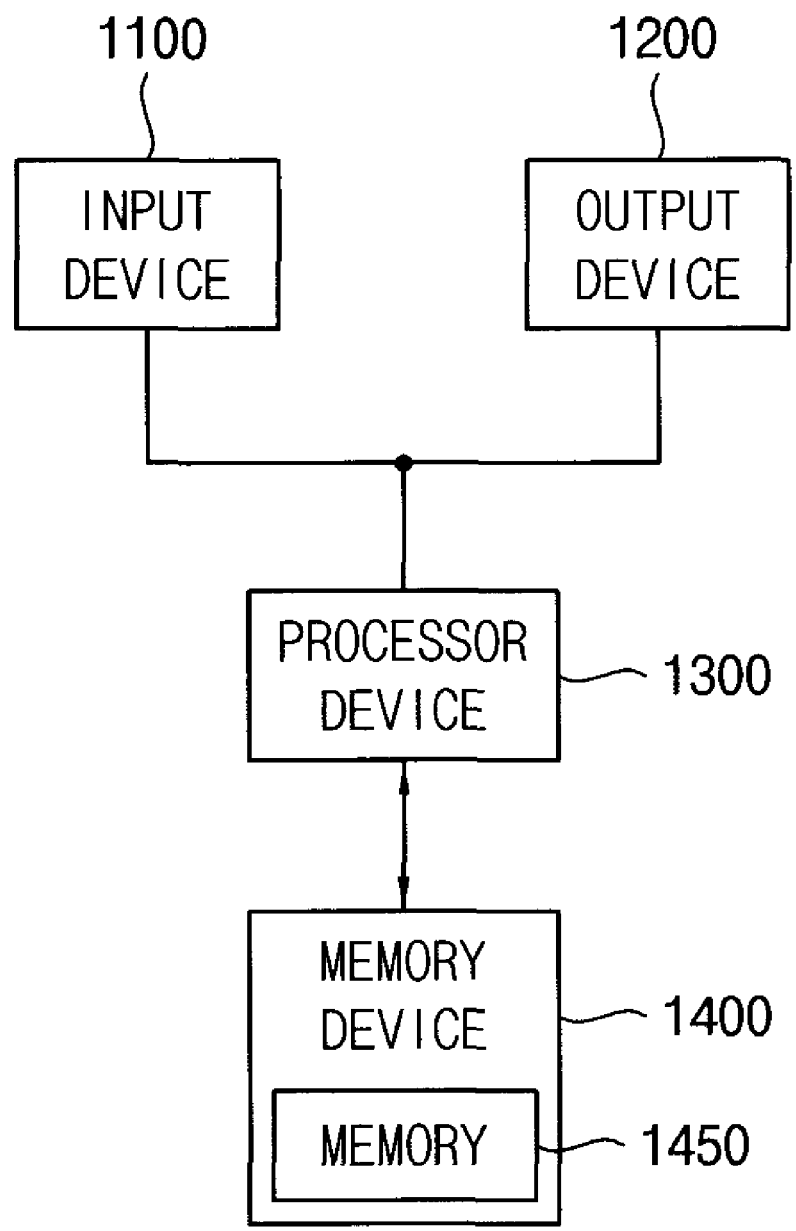
FIG. 13 is a block diagram illustrating an electronic system including the semiconductor memory device according to some example embodiments.

FIG. 13 is a block diagram illustrating an electronic system including the semiconductor memory device according to some example embodiments.

Referring to FIG. 13, an electronic system 1000 includes an input device 1100, an output device 1200, a processor device 1300 and a memory device 1400. The memory device 1400 may include a memory 1450 such as the memory 900 of FIG. 12. In addition, the memory device 1400 may include a multi-chip package, a package on package, etc.

The processor device 1300 controls the input device 1100, and the output device 1200, and the memory device 1400 through corresponding interfaces.

Figure 14:
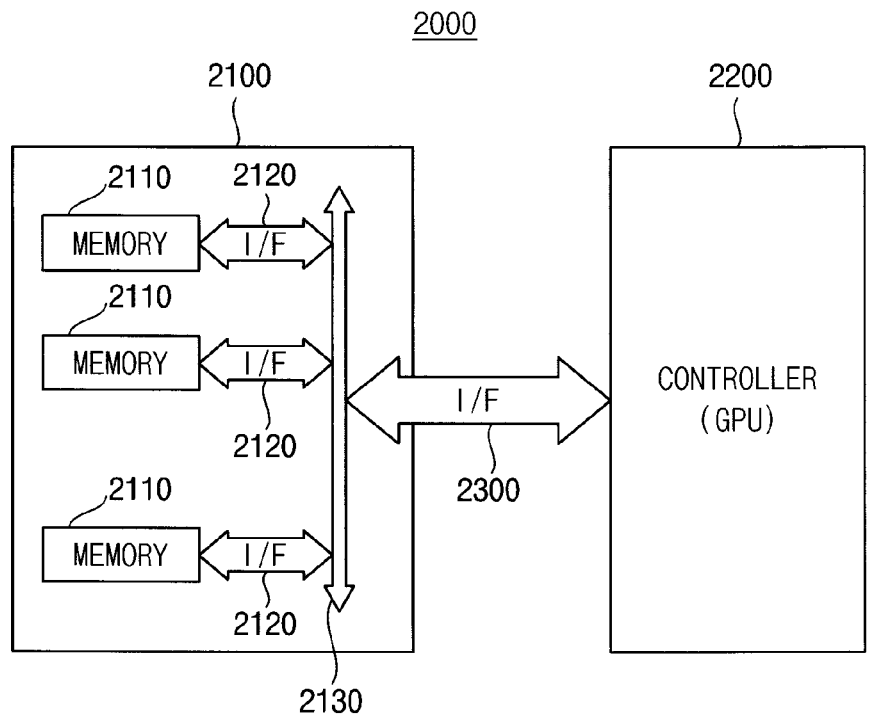
FIG. 14 is a block diagram illustrating a graphic memory system according to some example embodiments.

FIG. 14 is a block diagram illustrating a graphic card according to some example embodiments.

Referring to FIG. 14, a graphic card 2000 includes a memory group 2100, a controller 2200 such as a graphic processor unit (GPU) for controlling the memory group 2100 and a system bus 2300 connected between the memory group 2100 and the controller 2200. The memory group 2100 includes a plurality of memories 2110 such as the memory 900 of FIG. 12, an internal interface 2130 and memory interfaces 2120.

The controller 2200 may include a graphic engine core, and exchanges data with the memory group 2100. The system bus 2300, the internal interface 2130 and the memory interfaces 2120 may be integrated into one I/O, or may be separated. In addition, the system bus 2300, the internal interface 2130 and the memory interfaces 2120 may have data format which is varied based on architecture of an application system.

Figure 15:
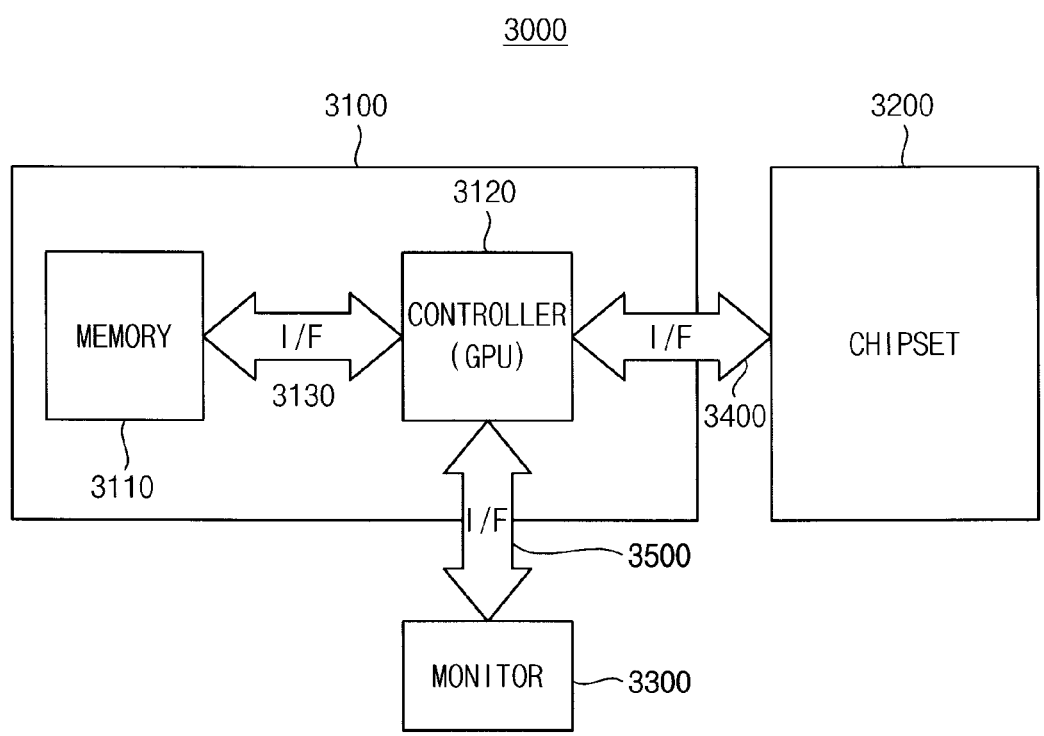
FIG. 15 is a block diagram illustrating a graphic card including the graphic memory system of FIG. 14 according to some example embodiments.

FIG. 15 is a block diagram illustrating a graphic card system including the graphic card of FIG. 14 according to some example embodiments.

Referring to FIG. 15, a graphic card system 3000 includes a graphic card 3100, a chipset 3200 a monitor 3300, a first interface 3400 and a second interface 3500. The graphic card 3100 includes a memory 3110, a controller 3120 such as a graphic processor unit (GPU) for controlling the memory 3110 and a system bus 3130 connected between the memory 3110 and the controller 3120. The controller 3120 exchanges data with the monitor 3300 through the second interface 3500 and the monitor 3300 receives image data and displays the received image data. The controller 3120 exchanges data with the chipset 3200 through the first interface 3400.

Each of the first and second interfaces 3400 and 3500 may use an interface protocol satisfying one of Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface ESDI, and Integrated Drive Electronics (IDE).

Figure 16:
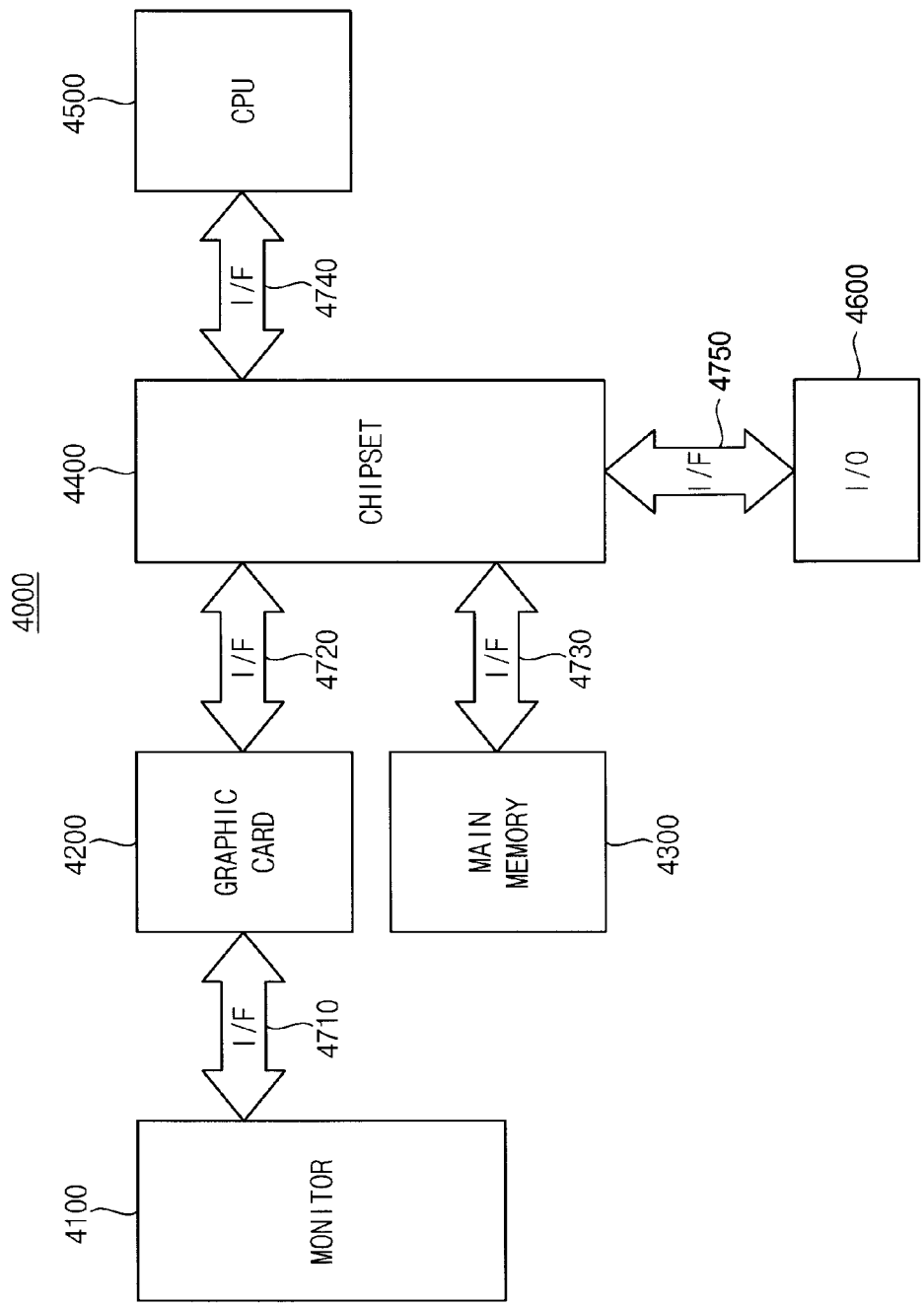
FIG. 16 is a block diagram illustrating a computing system including the graphic card of FIG. 15 according to some example embodiments.

FIG. 16 is a block diagram illustrating a computing system including the graphic card of FIG. 15 according to some example embodiments.

Referring to FIG. 16, a computing system 4000 includes a monitor 4100, a graphic card 4200, a main memory 4300, a chipset 4400, an input/output device 4600 and a central processing unit (CPU) 4500, which are connected to corresponding one through system buses 4710, 4720, 4730, 4740 and 4750.

The graphic card 4200 may employ the graphic card 3100 of FIG. 15 and the main memory 4300 may be mounted on the computing system 4000 in a configuration of memory modules.

When the computing system 4000 is a mobile device, PDA or Tablet, a battery for providing operating voltage of the computing system 4000 may be further included in the computing system 4000. Although not illustrated, the computing system 4000 may further includes an application chipset, a camera image processor (CIP) and a mobile DRAM.

The memory system and the computing system according to some example embodiments may be mounted on a printed circuit board (PCB) by using various packages. These various packages may include PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), MCP (Multi Chip Package), WFP (Wafer-level Fabricated Package) and WSP (Wafer-Level Processed Stack Package).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A phase interpolator, comprising:
a delay difference detector configured to detect a delay difference between a first input signal and a second input signal, and output a first delay control signal that indicates whether the delay difference is greater or smaller than a reference value; and
a phase interpolation driver including a first set of drivers, and configured to interpolate the first and second input signals based on the first delay control signal and output a phase interpolator output signal,
wherein the first set of drivers includes a first plurality of drivers and a second plurality of drivers, an input for each driver of the first plurality of drivers is connected to the first input signal, an input for each driver of the second plurality of drivers is connected to the second input signal, and outputs for the first and second plurality of drivers are commonly connected, and
wherein the first and second plurality of drivers are configured to be enabled when the delay difference is smaller than the reference value, and to be disabled when the delay difference is greater than the reference value.

2. The phase interpolator of claim 1, further comprising:
a second set of drivers including a third plurality of drivers and a fourth plurality of drivers, an input for each driver of the third plurality of drivers is connected to the first input signal, and an input for each driver of the fourth plurality of drivers is connected to the second input signal,
wherein the second set of drivers is configured to be controlled by second delay control signals, and
wherein the second delay control signals include a first plurality of pairs of control signals, each pair of control signals including a normal and a complementary delay control signal operating complementarily to each other.

3. The phase interpolator of claim 2, wherein the first plurality of drivers of the first set of drivers are configured to be enabled by third delay control signals, and the third delay control signals depend on the normal delay control signal of the second delay control signals when the delay difference is smaller than the reference value.

4. The phase interpolator of claim 3, wherein the second plurality of drivers of the first set of drivers are configured to be enabled by fourth delay control signals, and the fourth delay control signals depend on the complementary delay control signal of the second delay control signals when the delay difference is smaller than the reference value.

5. The phase interpolator of claim 4, wherein the fourth plurality of drivers of the second set of drivers are configured to be controlled based on inverted signals of the second control signals.

6. The phase interpolator of claim 1, further comprising a capacitive load connected to an output terminal of the phase interpolation driver,
wherein the capacitive load comprises a switch element and a capacitor connected between the switch element and a ground, wherein the switch element is configured to be turned on when the delay difference is greater than the reference value.

7. The phase interpolator of claim 1, wherein the first and second input signals are selected based on a delay code.

8. A delay locked-loop (DLL) circuit comprising:
a phase detector configured to compare a first clock signal and a feedback output signal;
a control logic circuit configured to output coarse lock information and fine lock information according to a comparison result of the phase detector;
a delay line circuit that includes a plurality of delay cells and is configured to receive a clock signal, output a first delayed clock signal and a second delayed clock signal, and perform coarse locking; and
a phase interpolator configured to interpolate the first delayed clock signal and the second delayed clock signal provided from the delay line circuit, and output a clock output signal, the phase interpolator comprising:
a delay difference detector configured to detect a delay difference between the first delayed clock signal and the second delayed clock signal, and output a first delay control signal that indicates whether the delay difference is greater or smaller than a reference value; and
a phase interpolation driver including a first set of drivers, and configured to interpolate the first and second delayed clock signals based on the first delay control signal, and output the clock output signal,
wherein the first set of drivers includes a first plurality of drivers and a second plurality of drivers, an input for each driver of the first plurality of drivers is connected to the first delayed clock signal, an input for each driver of the second plurality of drivers is connected to the second delayed clock signal, and outputs for the first and second plurality of drivers are commonly connected, and
wherein the first and second plurality of drivers are configured to be enabled when the delay difference is smaller than the reference value, and to be disabled when the delay difference is greater than the reference value.

9. The delay locked-loop (DLL) circuit of claim 8, further comprising:
a second set of drivers including a third plurality of drivers and a fourth plurality of drivers, an input for each driver of the third plurality of drivers is connected to the first delayed clock signal, and an input for each driver of the fourth plurality of drivers is connected to the second delayed clock signal,
wherein the second set of drivers is configured to be controlled by second delay control signals, and
wherein the second delay control signals include a first plurality of pairs of control signals, each pair of control signals including a normal and a complementary delay control signal operating complementarily to each other.

10. The delay locked-loop (DLL) circuit of claim 8, wherein the capacitive load is connected to the clock output signal to increase the capacitance of a node outputting the clock output signal when the delay difference is greater than the reference value.

11. The delay locked-loop (DLL) circuit of claim 10, wherein the capacitive load comprises a switch element and a capacitor connected between the switch element and a ground.

12. A method of interpolating a first clock signal and a second clock signal for a phase interpolator, the method comprising:
detecting a delay difference between the first and second clock signals;
increasing a driver ability of the phase interpolator when the delay difference is smaller than a reference value;
decreasing the driver ability of the phase interpolator when the delay difference is greater than the reference value; and
outputting an output signal of the phase interpolator according to the increased or decreased driver ability.

13. The method of claim 12, wherein increasing a driver ability includes enabling a set of drivers of the phase interpolator, and decreasing a driver ability includes disabling a set of drivers of the phase interpolator.

14. The method of claim 12, wherein increasing a driver ability includes increasing a slew rate of drivers of the phase interpolator, and decreasing a driver ability includes decreasing a slew rate of drivers of the phase interpolator.

15. The method of claim 12,
wherein detecting a delay difference includes outputting a first delay control signal that indicates whether the delay difference is greater or smaller than the reference value,
wherein increasing a driver ability of the phase interpolator includes enabling a first set of drivers based on the first delay control signal, and
wherein decreasing the driver ability of the phase interpolator includes disabling the first set of drivers based on the first delay control signal.

16. The method of claim 15, wherein the first set of drivers includes a first plurality of drivers and a second plurality of drivers, and further comprising:
inputting the first clock signal to each driver of the first plurality of drivers;
inputting the second clock signal to each driver of the second plurality of drivers; and
transmitting outputs of the first and second plurality of drivers to a common node.

17. The method of claim 15, wherein increasing a driver ability of the phase interpolator further includes enabling a second set of drivers based on second delay control signals, the second set of drivers including a third plurality of drivers and a fourth plurality of drivers, and further comprising:
inputting the first clock signal to each driver of the third plurality of drivers;
inputting the second clock signal to each driver of the fourth plurality of drivers.

18. The method of claim 17, further comprising controlling the fourth plurality of drivers of the second set of drivers based on inverted signals of the second control signals.

* * * * *